United States Patent
Kurihara et al.

(10) Patent No.: US 7,208,953 B2
(45) Date of Patent: Apr. 24, 2007

(54) MR DUCTOGRAPHY

(75) Inventors: Yasuyuki Kurihara, Kawasaki (JP); Marc Ivo Julia Van Cauteren, Meguro-ku (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/554,340

(22) PCT Filed: Apr. 23, 2004

(86) PCT No.: PCT/IB2004/050494

§ 371 (c)(1),
(2), (4) Date: Oct. 24, 2005

(87) PCT Pub. No.: WO2004/095045

PCT Pub. Date: Nov. 4, 2004

(65) Prior Publication Data

US 2006/0192555 A1    Aug. 31, 2006

(30) Foreign Application Priority Data

Apr. 24, 2003    (EP) ................................. 03101147

(51) Int. Cl.
*G01V 3/00*    (2006.01)

(52) U.S. Cl. .................................... 324/318; 600/424
(58) Field of Classification Search ............... 324/318; 600/424

See application file for complete search history.

(56) References Cited

U.S. PATENT DOCUMENTS 5,600,244 A    2/1997    Jensen
5,646,530 A *  7/1997    Strenk et al. ............... 324/318

OTHER PUBLICATIONS

Orel, S.G., et al.; MR Imaging in Patients with Nipple Discharge:Initial Experience; 2000; Radiology; 216:248-254.
Orel, S.G., et al.; Suspicious Breast Lesions: MR Imaging with Radiologic-Pathologic Correlation; 1994; Radiology; 190:485-493.

* cited by examiner

Primary Examiner—Louis M. Arana
(74) Attorney, Agent, or Firm—Thomas M. Lundin

(57) ABSTRACT

A magnetic resonance system and method are described for performing an improved magnetic resonance ductography which gives better resolution and higher signal to noise ratio than known systems and methods. Use is made of a small coil together with a post processing technique addressed to the improvement of the sensitivity of the coil. The magnetic resonance sequence used is a fat suppressed T2 weighted turbo spin echo sequence.

3 Claims, 1 Drawing Sheet

MR DUCTOGRAPHY

The invention relates to a magnetic resonance system arranged to acquire a magnetic resonance data from a volume using a magnetic resonance imaging system and a fat suppressed T2 weighted turbo spin echo sequence and further using a coil arrangement for receiving signal from the volume.

Female patients presenting with nipple discharge or where a dilatation of the ducts was seen on ultra-sound are candidates for further diagnostic examination. Techniques are known in the prior art for performing diagnostic procedures which will aid in making an accurate diagnostic, and in the case of carcinoma, will aid in staging, or estimation of further spread, of the disease pathology.

A form of imaging frequently used to investigate the phenomenon of nipple discharge is ductography. This is a special type of contrast enhanced mammography that visualizes the ducts and the intraductal pathology, that is to say, lesions in the breasts. It is a pre-operative study that facilitates the surgeon in performing accurate surgery with minimal tissue loss. Based on the ductogram the surgeon will determine whether either removal of the lesion will suffice or whether removal of the entire ductal system or even total mastectomy should be performed.

In the conventional technique, which is variously named ductography, galactography or ductogalactography, the suspected duct is dilated and cannulated with a dedicated needle by an interventional radiologist. After this preparation, approximately 1 ml of contrast agent is injected into the duct under investigation. Images are made with standard X-ray mammography equipment This procedure is painful for the patient and can only be performed by a specially trained radiologist. In about 20–30% of the cases the procedure is not successful, either because the cannulation is not done correctly or because there is extravasation of the contrast agent into the parenchyma. The latter condition is also painful.

Conventional ductography will be difficult to perform on women who have undergone severe nipple surgery and on women with nipple retraction. Some patients suffer from allergic reactions to the contrast agent shortly after the procedure. Further, the whole procedure takes about one hour and requires the assistance of a trained nurse and a mammography technologist in addition to the presence of the radiologist. In addition to the disadvantages already mentioned, the method exposes the patient to ionizing radiation.

An alternative technique using magnetic resonance imaging has been developed recently, for example in "MR Imaging in Patients with Nipple Discharge: Initial Experience", Greenstein Orel et al., Radiology 2000, 216:248–254. In this method, a fat-suppressed T2 weighted turbo spin echo sequence is used to image the breast. This new technique of magnetic resonance ductography has produced immediate advantages over the more traditional form of ductography. In particular, it is possible to image the whole ductal structure in one scan. Conventional ductography is limited to the duct where the needle is inserted. It is also now possible, using this new method, to visualize multiple lesions on one duct even if the a lesion is completely obstructing the duct and to determine the malignancy of a lesion based on shape characteristics and the infiltration of the lesion into the duct. It is possible to show the outside of the duct and not just the lumen as in the conventional mammography technique. The new technique therefore has improved specificity. There are other advantages to using magnetic resonance instead of contrast enhanced mammography and these include the ability to perform diagnostic imaging on every patient disregarding their medical history or possible allergic reactions to contrast agents, and the reduction of overall patient exposure to ionizing radiation.

Unfortunately, the spatial resolution of the images acquired is not very high. This reduces the visual separation in the image and means that very small objects are not reproduced in the image. The anatomical order of magnitude of the ducts within the ductal systems of the mammary gland is very small, of the order of only 0.5 mm to 1 mm. The size of any lesions might also be only 0.5 mm to 1 mm and so a higher resolution would be advantageous. In addition, high spatial resolution images normally have a low signal-to-noise ratio.

It is an object of the invention to produce a magnetic resonance system for acquiring a magnetic resonance ductography scan which has both higher resolution and a higher signal to noise ratio. This is achieved using the invention in which the coil arrangement includes a small coil of diameter between 3.7 cm and 5.7 cm and also includes a body coil, the small coil of diameter between 3.7 cm and 5.7 cm is used for receiving the magnetic resonance signal from the volume, the system further being arranged to, correct the magnetic resonance data received from the small coil of diameter between 3.7 cm and 5.7 cm using auxiliary values calculated from a first auxiliary measurement acquired from the body coil and from a second auxiliary measurement acquired from the small coil of diameter between 3.7 cm and 5.7 cm.

The invention also relates to a method for acquiring a magnetic resonance scan.

A microscopy coil, with a diameter of only 4.7 cm is used as a surface coil to acquire signal data from the ductal system. The construction of this coil allows the acquisition of signal locally with a very high signal-to-noise ratio. This high signal to noise ratio is used to increase the spatial resolution by acquiring a 512 matrix for a 7 cm field of view, resulting in a 0.137 mm resolution. The coil is placed right above the ducts under examination. The method can also be used where there is evidence of a pre-existing lesion, in which case the coil is placed directly over the lesion.

The size of the coil is chosen to cover the nipple area, or areola, of the breast. As such any diameter between 3.7 cm and 5.7 cm may be found to be useful, with the range of 4.2 cm and 5.2 cm giving good results. A diameter of 4.7 cm has been found to be particularly advantageous.

The high resolution is needed to get an image sharp enough to give a clinically useful differentiation of the shape of the lesion. This shape is correlated to the malignancy of the lesion.

An inherent property of these small coils which have a very high sensitivity locally is that their signal yield further away from the coil is low. This problem is overcome by using a post-processing technique which corrects for insensitivity. This correction technique is based on the measurement of the sensitivity profile of the receiver coil. Since the sensitivity is actually measured the correction for it can be perfect resulting in a flat signal level. The technique is performed by acquiring auxiliary signals from both the small coil itself and also from a body coil. These auxiliary signals are used to produce auxiliary values which are then used to correct the image data from the small coil. The technique is known to persons skilled in the art by the name of CLEAR.

The combination of the use of the microscopy coil to receive the signal and the CLEAR post-processing to correct for signal inhomogeneities results in ductographic images with high diagnostic value.

The method for acquiring a magnetic resonance image using magnetic resonance data from a volume uses a fat suppressed T2 weighted turbo spin echo sequence in combination with a coil arrangement for receiving signal from the volume. The coil arrangement includes a small coil of diameter between 3.7 cm and 5.7 cm and also includes a body coil. In particular, a coil of diameter 4.7 cm can be used. The small coil is used for receiving the magnetic resonance signal from the volume and so is placed directly onto the volume of interest. The magnetic resonance data received from this coil is then corrected using auxiliary values calculated from a first auxiliary measurement acquired from the body coil and from a second auxiliary measurement acquired from the small coil itself.

These and further aspects of the invention will be explained using the following figures.

FIG. 1 shows an example of a coil used in the invention, shown against an adult hand for comparison.

Figure 1:
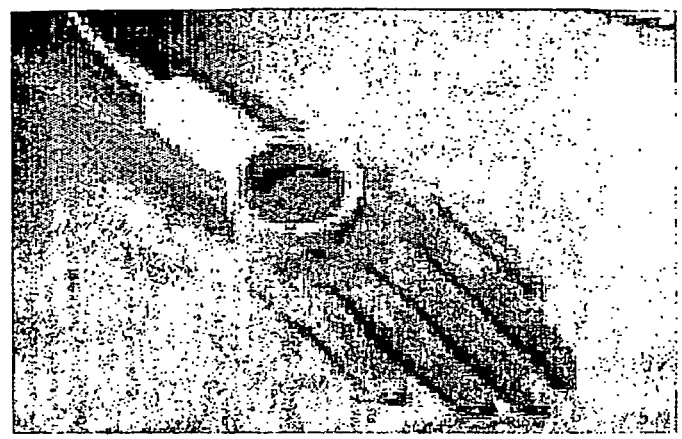
FIG. 1 shows an example of a coil used in the invention.
Figure 2:
FIG. 2 shows an example of ductal lesions which can be imaged using the invention.

FIG. 2 shows an example of ductal lesions which can be imaged using the invention. It shows multiple lesions in one duct indicated by arrows. The inplane resolution is about 0.140 mm.

Figure 3:
FIG. 3 shows a maximum intensity projection of the same case as shown in FIG. 2.

FIG. 3 is a maximum intensity projection, or MIP, of the same case showing the complete ductal structure from the nipple down to the chest. The MIP clearly shows the advantage of using the post processing technique to correct for insensitivity of the small coil used. Homogeneous signal intensity over the whole ductal structure is shown. The width of the duct at the nipple is about 1.5 mm.

The invention claimed is:

1. A magnetic resonance system arranged to acquire a magnetic resonance data from a volume using a magnetic resonance imaging system and a fat suppressed T2 weighted turbo spin echo sequence and further using a coil arrangement for receiving signal from the volume, wherein, the coil arrangement includes a small coil of diameter between 3.7 cm and 5.7 cm and also includes a body coil, the small coil of diameter between 3.7 cm and 5.7 cm is used for receiving the magnetic resonance signal from the volume, the system further being arranged to correct the magnetic resonance data received from the small coil of diameter between 3.7 cm and 5.7 cm using auxiliary values calculated from a first auxiliary measurement acquired from the body coil and from a second auxiliary measurement acquired from the small coil of diameter between 3.7 cm and 5.7 cm.

2. A magnetic resonance system as claimed in claim 1, wherein the small coil has a diameter of between 4.2 cm and 5.2 cm.

3. A method for acquiring magnetic resonance data from a volume using a magnetic resonance imaging system and a fat suppressed T2 weighted turbo spin echo sequence and further using a coil arrangement for receiving signal from the volume, wherein, the coil arrangement includes a small coil of diameter between 3.7 cm and 5.7 cm and also includes a body coil, the small coil of diameter between 3.7 cm and 5.7 cm is used for receiving the magnetic resonance signal from the volume, the method further comprising, correcting the magnetic resonance data received from the small coil of diameter between 3.7 cm and 5.7 cm using auxiliary values calculated from a first auxiliary measurement acquired from the body coil and from a second auxiliary measurement acquired from the small coil of diameter between 3.7 cm and 5.7 cm.

* * * * *